United States Patent
Ko et al.

(10) Patent No.: US 6,781,321 B2
(45) Date of Patent: Aug. 24, 2004

(54) ORGANIC ELECTROLUMINESCENT DISPLAY HAVING POWER LINE PARALLEL TO GATE LINE AND FABRICATING METHOD THEREOF

(75) Inventors: Doo-Hyun Ko, Gyeonggi-do (KR); Chang-Wook Han, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/331,304

(22) Filed: Dec. 31, 2002

(65) Prior Publication Data

US 2003/0173564 A1 Sep. 18, 2003

(30) Foreign Application Priority Data

Mar. 13, 2002 (KR) .................................. 10-2002-0013445

(51) Int. Cl.[7] ................................................. G09G 3/32
(52) U.S. Cl. ....................................... 315/169.3; 345/76
(58) Field of Search ............................ 315/169.3, 169.4, 315/169.1; 345/76, 77

(56) References Cited

U.S. PATENT DOCUMENTS

2003/0128173 A1 * 7/2003 Ko ............................... 345/82

* cited by examiner

*Primary Examiner*—David Vu
(74) *Attorney, Agent, or Firm*—Morgan Lewis & Bockius LLP

(57) ABSTRACT

An active matrix organic electroluminescent device includes a substrate, a gate line on the substrate, a data line on the substrate, the data line crossing the gate line to define a pixel region, a first switching thin film transistor connected to the gate line and the data line, a first driving thin film transistor connected to the first switching thin film transistor, a power line connected to the first driving thin film transistor and parallel to the gate line, a capacitor electrode connected to the first driving thin film transistor and overlapping the power line, and a pixel electrode connected to the first driving thin-film transistor and covering the pixel region.

22 Claims, 4 Drawing Sheets

ORGANIC ELECTROLUMINESCENT DISPLAY HAVING POWER LINE PARALLEL TO GATE LINE AND FABRICATING METHOD THEREOF

The present invention claims the benefit of the Korean Patent Application No. P2002-13445 filed in Korea on Mar. 13, 2002, which is hereby incorporated by reference.

BACKGROUND OF THE INVENTION

1. Field of the Invention

The present invention relates to an organic electroluminescent device, and more particularly, to an active matrix organic electroluminescent device including a thin film transistor.

2. Discussion of the Related Art

A cathode ray tube (CRT) has been widely used as a display screen for devices, such as televisions and computer monitors. However, a CRT has the disadvantages of being large, heavy, and requiring a high drive voltage. As a result, flat panel displays (FPDs) that are smaller, lighter, and require less power have grown in popularity. Liquid crystal display (LCD) devices, plasma display panel (PDP) devices, field emission display (FED) devices, and electroluminescence display (ELD) devices are some of the types of FPDs that have been introduced in recent years.

An ELD device may either be an inorganic electroluminescence display device or an organic electroluminescence display (OELD) device depending upon the source material used to excite carriers in the device. OELD devices have been particularly popular because they have bright displays, low drive voltages, and can produce natural color images incorporating the entire visible light range. Additionally, OELD devices have a preferred contrast ratio because they are self-luminescent. OELD devices can easily display moving images because they have a short response time of only several microseconds. Moreover, such devices are not limited to a restricted viewing angle as other ELD devices are. OELD devices are stable at low temperatures. Furthermore, their driving circuits can be cheaply and easily fabricated because the circuits require only a low operating voltage, for example, about 5V to 15V DC (direct current). In addition, the process used to manufacture OELD devices is relatively simple.

In general, an OELD device emits light by injecting electrons from a cathode electrode and holes from an anode electrode into an emissive layer, combining the electrons with the holes, generating an exciton, and transitioning the exciton from an excited state to a ground state. Since the mechanism by which an OELD produces light is similar to a light emitting diode (LED), the organic electroluminescence display device may also be called an organic light emitting diode.

An active matrix OELD where a plurality of pixel regions are disposed in the form of a matrix and a thin film transistor (TFT) is disposed in each pixel region is widely used in FPDs. An exemplary active matrix organic electroluminescent device is illustrated in FIG. 1.

FIG. 1 is a circuit diagram of an active matrix organic electroluminescent device according to the related art. In FIG. 1, one pixel region of an active matrix organic electroluminescent device is composed of a switching TFT 4, a driving TFT 5, a storage capacitor 6, and an organic electroluminescent (EL) diode 7. A gate electrode of the switching TFT 4 is connected to a gate line 1, the source electrode of the switching TFT 4 is connected to a data line 2, and the drain electrode of the switching TFT 4 is connected to a gate electrode of the driving TFT 5. The source electrode of the driving TFT 5 is connected to a power line 3, and the drain electrode of the driving TFT 5 is connected to an anode of the organic EL diode 7. A cathode of the organic EL diode 7 is grounded. The storage capacitor 6 is connected to the gate and source electrodes of the driving TFT 5. When a scanning signal is applied to the gate electrode of the switching TFT 4 through the gate line 1 and an image signal is applied to the drain electrode of the switching TFT 4 through the data line 2, the switching TFT 4 is turned ON. The image signal is stored in the storage capacitor 6 through the switching TFT 4. The image signal is also applied to the gate electrode of the driving TFT 5. As a result, a turn-on rate of the driving TFT 5 is determined. The current that passes through the channel of the driving TFT 5 in turn passes through the organic EL diode 7 causing the organic EL diode 7 to emit light in proportion to the current density. Since the current density is proportional to the turn-on rate of the driving TFT 5, the brightness of the light can be controlled by the image signal. The driving TFT 5 may be driven by charge stored in the storage capacitor 6 even when the switching TFT 4 is turned OFF. Accordingly, the current through the organic EL diode 7 is persistent until a next image signal is applied. As a result, light is emitted from the organic EL diode 7 until a next image signal is applied.

FIG. 2 is a schematic plan view of an active matrix organic electroluminescent device according to the related art. In FIG. 2, a gate line 21 crosses a data line 22 defining a pixel region P. A switching thin film transistor (TFT) $T_S$ is connected to the gate line 21 and the data line 22. A driving TFT $T_D$ connected to the switching TFT $T_S$ is disposed in the pixel region P. A gate electrode 41 of the driving TFT $T_D$ is connected to a drain electrode 31 of the switching TFT $T_S$. A source electrode 42 of the driving TFT $T_D$ is connected to a power line 51 that is parallel to the data line 22. The drain electrode 43 of the driving TFT $T_D$ is connected to a pixel electrode, which is composed of a transparent conductive material. A first capacitor electrode 52 connected to the power line 51 is also disposed in the pixel region P. A second capacitor electrode 71 and 72, which is composed of polycrystalline silicon, is connected to a gate electrode 41 of the driving TFT $T_D$. The second capacitor electrode 71 and 72 overlaps the first capacitor electrode 52 and the power line 51, thereby constituting a storage capacitor.

The organic electroluminescent device according to the related art includes a plurality of thin film transistors in one pixel region. Furthermore, since a power line is disposed in a vertical direction, the power line occupies a large portion of the pixel region. Thus, the area dedicated to the pixel electrode is reduced and the aperture ratio is accordingly reduced. As a result, the brightness of the light produced by the active matrix organic electroluminescent device is reduced.

SUMMARY OF THE INVENTION

Accordingly, the present invention is directed to an organic electroluminescent device that substantially obviates one or more of the problems due to limitations and disadvantages of the related art.

An object of the present invention is to provide an active matrix organic electroluminescent device where brightness is improved due to an increase in the aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescent device includes a substrate, a gate line on the substrate, a data line on the substrate, the data line crossing the gate line to define a pixel region, a first switching thin film transistor connected to the gate line and the data line, a first driving thin film transistor connected to the first switching thin film transistor, a power line connected to the first driving thin film transistor and parallel to the gate line, a capacitor electrode connected to the first driving thin film transistor and overlapping the power line, and a pixel electrode connected to the first driving thin film transistor and covering the pixel region.

In another aspect, an active matrix organic electroluminescent device includes a substrate, a gate line on the substrate, a data line on the substrate, the data line crossing the gate line to define a pixel region having a rectangular shape including two long sides and two short sides, a first switching thin film transistor connected to the gate line and the data line, a first driving thin film transistor connected to the first switching thin film transistor, a power line connected to the first driving thin film transistor in parallel with the two short sides of the pixel region, a capacitor electrode connected to the first driving thin film transistor and overlapping the power line, and a pixel electrode connected to the first driving thin film transistor and covering the pixel region.

In another aspect, a method of fabricating an active matrix organic electroluminescent device includes steps of forming a gate line on a substrate, forming a data line on the substrate, the data line crossing the gate line to define a pixel region, forming a first switching thin film transistor connected to the gate line and the data line, forming a first driving thin film transistor connected to the first switching thin film transistor, forming a power line connected to the first driving thin film transistor in parallel with the gate line, forming a capacitor electrode connected to the first driving thin film transistor to overlap the power line, and forming a pixel electrode connected to the first driving thin film transistor to cover the pixel region.

In another aspect, A method of fabricating an active matrix organic electroluminescent device includes steps of forming a gate line on a substrate, forming a data line on the substrate, the data line crossing the gate line to define a pixel region having a rectangular shape including two long sides and two short sides, forming a first switching thin film transistor connected to the gate line and the data line, forming a first driving thin film transistor connected to the first switching thin film transistor, forming a power line connected to the first driving thin film transistor in parallel with the two short sides of the pixel region, forming a capacitor electrode connected to the first driving thin film transistor to overlap the power line, and forming a pixel electrode connected to the first driving thin film transistor to cover the pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
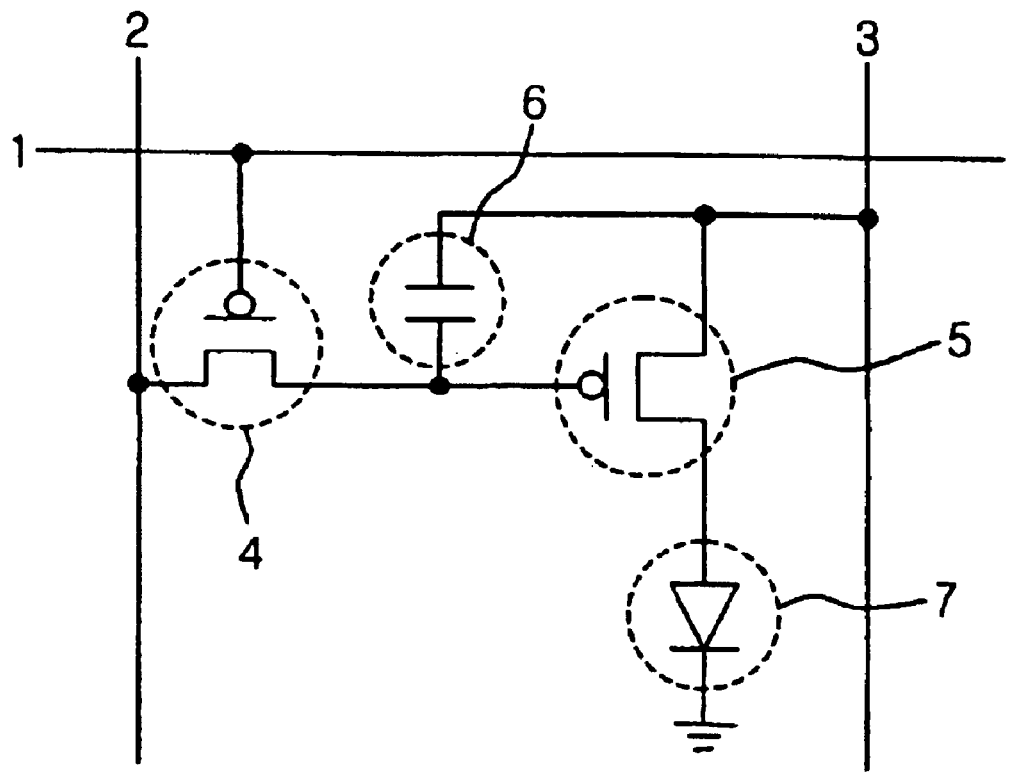
FIG. 1 is a circuit diagram of an active matrix organic electroluminescent device according to the related art.
Figure 2:
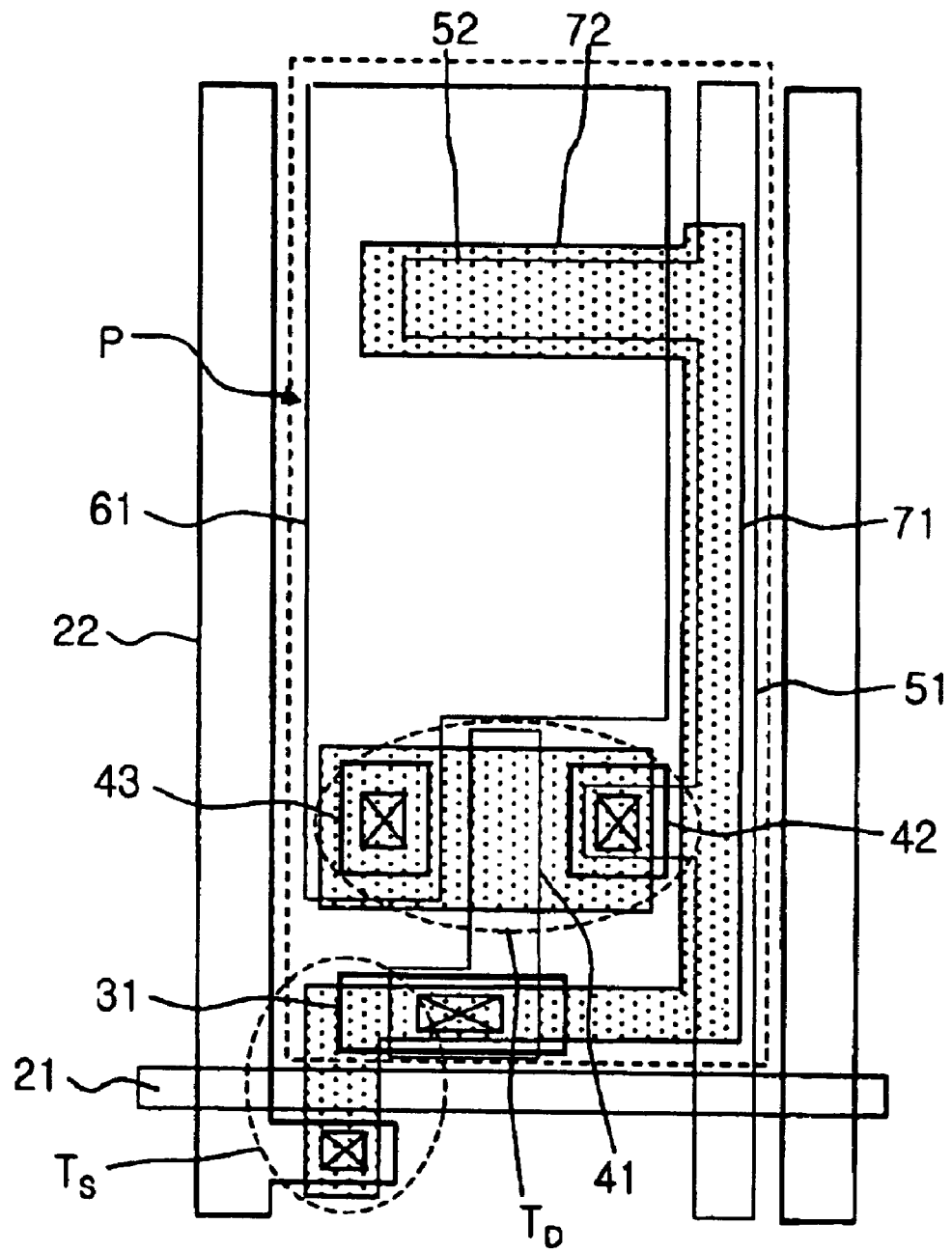
FIG. 2 is a schematic plan view of an active matrix organic electroluminescent device according to the related art.
Figure 3:
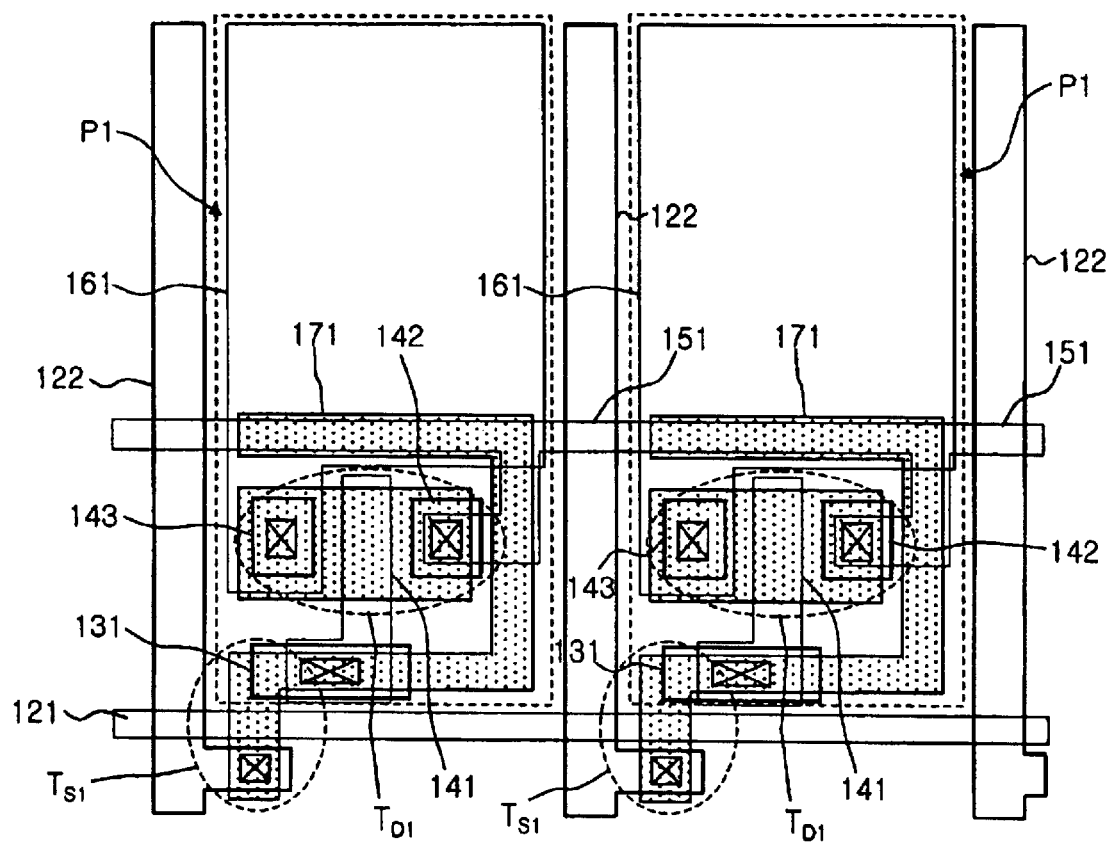
FIG. 3 is a schematic plan view of an exemplary organic electroluminescent device according to the present invention.

FIG. 3 is a schematic plan view of an exemplary organic electroluminescent device according to the present invention.

In FIG. 3, a gate line 121 may cross a data line 122 to define a pixel region P1. A switching thin film transistor (TFT) $T_{S1}$ may be disposed at the crossing point of the gate line 121 and the data line 122. The switching TFT $T_{S1}$ may be connected to the gate line 121 and the data line 122. A portion of the gate line 121 may function as a gate electrode of the switching TFT $T_{S1}$. A driving TFT $T_{D1}$ may be connected to the switching TFT $T_{S1}$ and may be disposed in the pixel region P1. A gate electrode 141 of the driving TFT $T_{D1}$ may be connected to a drain electrode 131 of the switching TFT $T_{S1}$. Moreover, a power line 151 parallel to the gate line 121 may be formed in the pixel region P1 along a horizontal direction and may extend to an adjacent pixel region. The power line 151 may be formed of the same material as the gate line 121 during the process of forming the gate line 121. Alternatively, the power line 151 may be formed of a different conductive material. A source electrode 142 of the driving TFT $T_{D1}$ may be connected to the power line 151. A drain electrode 143 of the driving TFT $T_{D1}$ may be connected to a pixel electrode 161. The pixel electrode 161 may include a transparent conductive material such as indium-tin-oxide (ITO) or indium-zinc-oxide (IZO), for example. A capacitor electrode 171 that includes impurity-doped polycrystalline silicon may be connected to the gate electrode 141 of the driving TFT $T_{D1}$ and may overlap the power line 151 to form a storage capacitor.

The pixel region P1 may have a rectangular shape. Two sides of the pixel region P1 may be longer than the other two sides. The two longer sides may be parallel to the data line 122, and the two shorter sides may be parallel to the gate line 121. The power line 151 may be formed parallel to the two shorter sides of the pixel region P1. Since the power line 151 is formed parallel to the gate line 121 and in a horizontal direction, the power line 151 may extend to an adjacent pixel region. As a result, the pixel electrode 161 may be enlarged. Accordingly, the aperture ratio of the organic electroluminescent device may increase.

Although the pixel region in FIG. 3 includes 2 TFTs, a pixel region may include a greater number of TFTs to improve the uniformity and quality of displayed images. In a preferred embodiment, the pixel region may include four TFTs as in FIG. 4.

Figure 4:
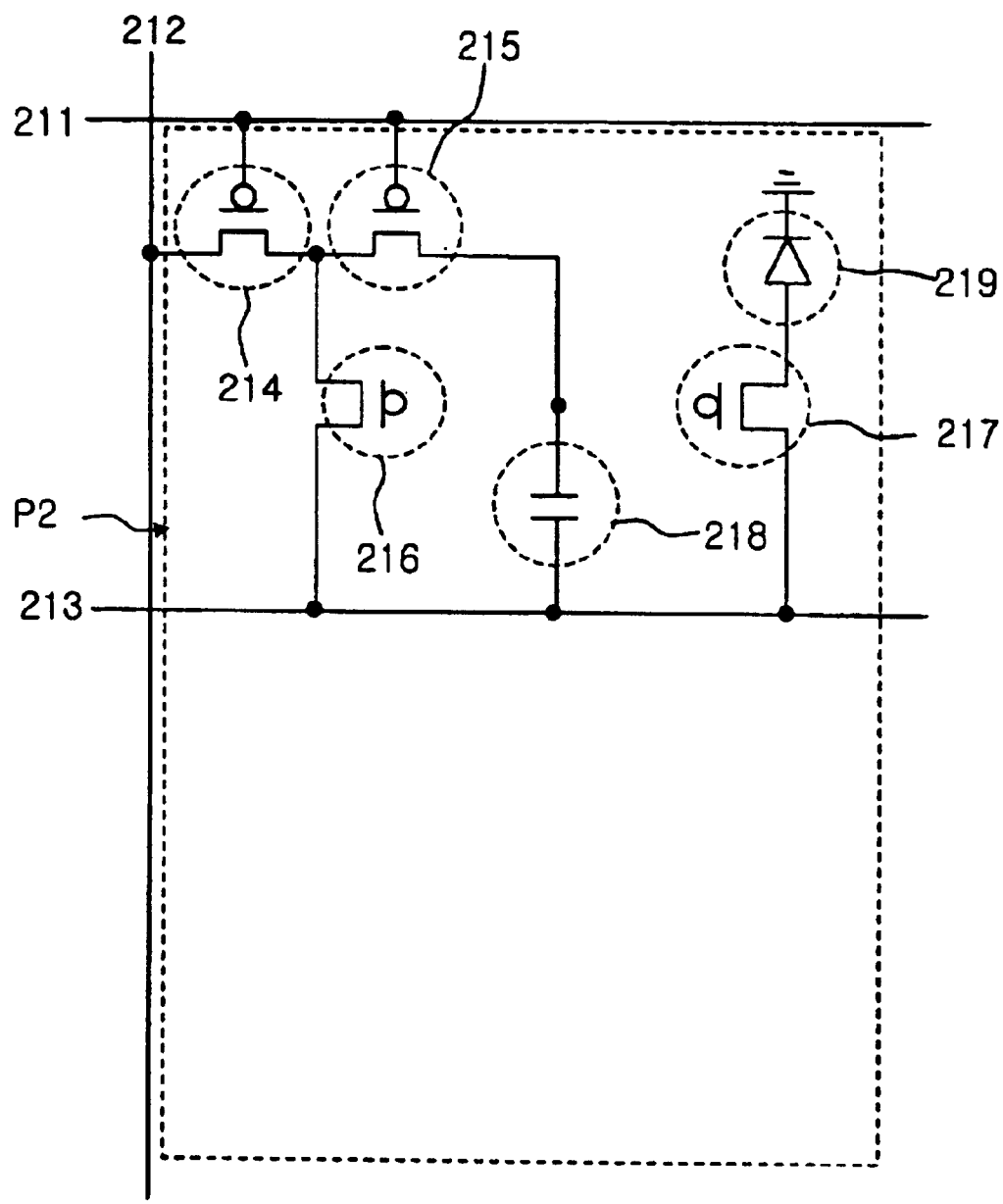
FIG. 4 is a circuit diagram of another exemplary active matrix organic electroluminescent device according to the present invention.

FIG. 4 is a circuit diagram of another exemplary active matrix organic electroluminescent device according to the present invention. In FIG. 4, a gate line 211 may cross a data line 212 to define a pixel region P2. The pixel region P2 may include first and second switching thin film transistors (TFTs) 214 and 215, first and second driving TFTs 216 and 217, a storage capacitor 218, and an organic electroluminescent (EL) diode 219. Gate electrodes of the first and second switching TFTs 214 and 215 may be connected to the gate line 211. A source electrode of the first switching TFT 214 may be connected to the data line 212. A drain electrode of the first switching TFT 214 may be connected to a source electrode of the second switching TFT 215 and a source electrode of the first driving TFT 216. A gate electrode of the first driving TFT 216 may be connected to a drain electrode of the second switching TFT 215 and a gate electrode of the second driving TFT 217. A source electrode of the second driving TFT 217 may be connected to a drain electrode of the first driving TFT 216 and the power line 213. A drain electrode of the second driving TFT 217 may be connected to an anode of the organic EL diode 219. A cathode of the organic EL diode 219 may be grounded. The first and second driving TFTs 216 and 217 may be connected to the storage capacitor 218. A first capacitor electrode of the storage capacitor 218 may be connected to the drain electrode of the first driving TFT 216 and a source electrode of the second driving TFT 217. A second capacitor electrode of the storage capacitor 218 may be connected to the gate electrode of the first driving TFT 216 and the gate electrode of the second driving TFT 217.

If the first and second switching TFTs 214 and 215 are turned ON due to a scanning signal applied to the gate line 211, an image signal applied to the data line 212 may be transferred to the first and second driving TFTs 216 and 217. Accordingly, the second driving TFT 217 may be turned ON and a current of the power line 213 may be transferred to the organic EL diode 219, which may cause light to be emitted from the organic EL diode 219. The power line 213 may be formed parallel to the gate line 211 in a horizontal direction.

Since a power line may be formed parallel to a gate line and in a horizontal direction, the power line may extend to an adjacent pixel region. As a result, an aperture ratio may be improved by enlarging a pixel electrode. Accordingly, improved brightness of an active matrix organic electroluminescent display device may result.

It will be apparent to those skilled in the art that various modifications and variations can be made in the organic electroluminescence display device of the present invention without departing from the spirit or scope of the invention. Thus, it is intended that the present invention cover the modifications and variations of this invention provided they come within the scope of the appended claims and their equivalents.

What is claimed is:

1. An active matrix organic electroluminescent device, comprising:
   a substrate;
   a gate line on the substrate;
   a data line on the substrate, the data line crossing the gate line to define a pixel region;
   a first switching thin film transistor connected to the gate line and the data line;
   a first driving thin film transistor connected to the first switching thin film transistor;
   a power line connected to the first driving thin film transistor and parallel to the gate line;
   a capacitor electrode connected to the first driving thin film transistor and overlapping the power line; and
   a pixel electrode connected to the first driving thin film transistor and covering the pixel region,
   wherein the power line extends across the data line.

2. The device according to claim 1, wherein the gate line and the power line are formed along a horizontal direction and the data line is formed along a vertical direction.

3. The device according to claim 1, wherein the power line is connected to another power line of the adjacent pixel region.

4. The device according to claim 1, wherein the power line includes the same material as the gate line.

5. The device according to claim 1, wherein the first driving thin film transistor includes a gate electrode, a source electrode, and a drain electrode.

6. The device according to claim 5, wherein the capacitor electrode is connected to the gate electrode of the first driving thin film transistor.

7. The device according to claim 1, wherein the capacitor electrode includes impurity-doped polycrystalline silicon.

8. The device according to claim 1, wherein the pixel electrode includes a transparent conductive material.

9. The device according to claim 1, further comprising a second switching thin film transistor connected to the first switching thin film transistor.

10. The device according to claim 9, further comprising a second driving thin film transistor connected to the first driving thin film transistor and the second switching thin film transistor.

11. An active matrix organic electroluminescent device, comprising:
    a substrate;
    a gate line on the substrate;
    a data line on the substrate, the data line crossing the gate line to define a pixel region having a rectangular shape including two long sides and two short sides;
    a first switching thin film transistor connected to the gate line and the data line;
    a first driving thin film transistor connected to the first switching thin film transistor;
    a power line connected to the first driving thin film transistor in parallel with the two short sides of the pixel region;
    a capacitor electrode connected to the first driving thin film transistor and overlapping the power line; and
    a pixel electrode connected to the first driving thin film transistor and covering the pixel region,
    wherein the power line extends across the data line.

12. A method of fabricating an active matrix organic electroluminescent device, comprising steps of:
    forming a gate line on a substrate;
    forming a data line on the substrate, the data line crossing the gate line to define a pixel region;
    forming a first switching thin film transistor connected to the gate line and the data line;
    forming a first driving thin film transistor connected to the first switching thin film transistor;
    forming a power line connected to the first driving thin film transistor in parallel with the gate line;
    forming a capacitor electrode connected to the first driving thin film transistor to overlap the power line; and
    forming a pixel electrode connected to the first driving thin film transistor to cover the pixel regions,
    wherein the power line extends across the data line.

13. The method according to claim 12, wherein the gate line and the power line are formed along a horizontal direction and the data line is formed along a vertical direction.

14. The method according to claim 12, wherein the power line is connected to another power line of the adjacent pixel region.

15. The method according to claim 12, wherein the power line includes the same material as the gate line.

16. The method according to claim 12, wherein the first driving thin film transistor includes a gate electrode, a source electrode, and a drain electrode.

17. The method according to claim 16, wherein the capacitor electrode is connected to the gate electrode of the first driving thin film transistor.

18. The method according to claim 12, wherein the capacitor electrode includes impurity-doped polycrystalline silicon.

19. The method according to claim 12, wherein the pixel electrode includes a transparent conductive material.

20. The method according to claim 12, further comprising a second switching thin film transistor connected to the first switching thin film transistor.

21. The method according to claim 20, further comprising a second driving thin film transistor connected to the first driving thin film transistor and the second switching thin film transistor.

22. A method of fabricating an active matrix organic electroluminescent device, comprising steps of:

forming a gate line on a substrate;

forming a data line on the substrate, the data line crossing the gate line to define a pixel region having a rectangular shape including two long sides and two short sides;

forming a first switching thin film transistor connected to the gate line and the data line;

forming a first driving thin film transistor connected to the first switching thin film transistor;

forming a power line connected to the first driving thin film transistor in parallel with the two short sides of the pixel region;

forming a capacitor electrode connected to the first driving thin film transistor to overlap the power line; and forming a pixel electrode connected to the first driving thin film transistor to cover the pixel region, wherein the power line extends across the data line.

* * * * *